(12) United States Patent
Watanabe et al.

(10) Patent No.: US 6,783,840 B2
(45) Date of Patent: Aug. 31, 2004

(54) RESIST INK COMPOSITION

(75) Inventors: Takeo Watanabe, Chiba (JP); Takashi Sato, Chiba (JP); Hirotaka Tagoshi, Chiba (JP)

(73) Assignee: Showa Denko K.K., Tokyo (JP)

( * ) Notice: Subject to any disclaimer, the term of this patent is extended or adjusted under 35 U.S.C. 154(b) by 1 day.

(21) Appl. No.: 09/959,522

(22) PCT Filed: Jul. 19, 2001

(86) PCT No.: PCT/JP01/06309

§ 371 (c)(1),
(2), (4) Date: Oct. 29, 2001

(87) PCT Pub. No.: WO02/08347

PCT Pub. Date: Jan. 31, 2002

(65) Prior Publication Data

US 2003/0022958 A1 Jan. 30, 2003

Related U.S. Application Data

(60) Provisional application No. 60/246,596, filed on Nov. 8, 2000.

(30) Foreign Application Priority Data

Jul. 21, 2000 (JP) .......................................... 2000-219997

(51) Int. Cl.$^7$ .......................... C08G 65/26; C08G 1/54; C08G 1/73; B32B 27/00
(52) U.S. Cl. ........................... 428/209; 522/25; 522/15; 522/129; 522/146; 522/168; 522/170; 430/280.1; 528/406; 528/417
(58) Field of Search ...................... 430/280.1; 428/209; 522/31, 32, 141, 142, 143, 144, 146, 168, 170, 15, 25; 528/417, 421, 403, 405, 406, 410

(56) References Cited

U.S. PATENT DOCUMENTS

| | | | | |
|---|---|---|---|---|
| 3,388,105 A | * | 6/1968 | Danielisz et al. | ............ 528/365 |
| 3,457,193 A | | 7/1969 | Tinsley et al. | |
| 5,882,842 A | | 3/1999 | Akaki et al. | |
| 6,054,501 A | * | 4/2000 | Taniguchi et al. | ............. 522/31 |
| 6,084,004 A | * | 7/2000 | Weinmann et al. | ............ 522/25 |
| 6,190,833 B1 | * | 2/2001 | Shiota et al. | ............. 430/280.1 |
| 6,232,361 B1 | * | 5/2001 | Laksin et al. | .................. 522/84 |
| 6,287,745 B1 | * | 9/2001 | Yamamura et al. | ......... 430/269 |
| 6,361,924 B1 | * | 3/2002 | Yabuuchi et al. | ........ 430/280.1 |

FOREIGN PATENT DOCUMENTS

| | | |
|---|---|---|
| FR | 1463054 A | 12/1966 |
| JP | 11-152441 A | 6/1999 |
| WO | WO97/47660 * | 12/1997 |
| WO | WO 01-83580 A | 11/2001 |

OTHER PUBLICATIONS

Patent Abstracts of Japan, JP 11–152441, date Jun. 8, 1999.

\* cited by examiner

*Primary Examiner*—Susan Berman
(74) *Attorney, Agent, or Firm*—Sughrue Mion, PLLC

(57) ABSTRACT

The present invention provides a resist ink composition comprising a compound (a) having at least one oxetanyl group and at least one epoxy group within the same molecule and a compound (b) capable of initiating cationic polymerization under irradiation by an active energy ray and/or under heat. This resist ink composition has high photosensitivity and enables the final curing by a brief heating and the cured film exhibits good physical properties.

11 Claims, No Drawings

RESIST INK COMPOSITION

CROSS REFERENCE TO RELATED APPLICATION

This application is based on U.S. Provisional application No. 60/246,596, filed on Nov. 8, 2000.

TECHNICAL FIELD

The present invention relates to a resist ink composition for use in the process of producing a printed circuit board, and a method for obtaining a cured film using the composition. More specifically, the present invention relates to a resist ink composition capable of forming an image under exposure to an ultraviolet light, having high sensitivity and capable of being cured by a short heat curing treatment following the formation of a pattern; as well as to a cured film using the composition; and to a method for producing the cured film.

BACKGROUND ART

In recent years, with the progress of techniques for forming a finer pattern for a printed wiring board circuit to cope with the downsizing and higher performance of electrical instruments, the material used for a solder resist is required to have processability in a micro-order. The solder resist is used to provide a film on the front surface portion of a circuit conductor except the portions for soldering, and prevents the solder from attaching to undesirable portions when soldering electric parts to a printed wiring board, and also functions as a protective film to prevent the circuit conductor from being exposed directly to air and being corroded by oxidation or moisture. The solder resist is heretofore mainly applied to a printed board by a screen printing method to form a pattern and then cured by ultraviolet light or heat. However, due to the requirements of higher resolution and higher precision, attention is being focused on a liquid photosolder resist method, irrespective of either for a civil board or for an industrial board.

This photosolder resist is generally formed into a pattern using a photosensitive resin comprising a radical polymerization initiator and a resin having a (meth)acrylate group. However, printed boards are moving toward finer patterns and higher functions and, with this tendency, as described in JPP-61-243869 (the term "JPP" as used herein means an "Japanese Unexamined Patent Publication (Kokai)"), a composition prepared by mixing an epoxy resin having low curing shrinkage and excellent electrical properties with a composition comprising a photo-radical polymerization initiator and a resin having a (meth)acrylate group is becoming the main photosensitive resin composition.

However, in view of forming a pattern under light irradiation within a short time, there is a limit in reducing the blending amount of the resin having a (meth)acrylate group, and therefore, this method of adding an epoxy resin fails to satisfy both productivity and resistance against water or hydrolysis requirements at the same time.

On the other hand, from the standpoint of providing a high-density printed board, studies have been made to develop a multilayer laminate board. In conventional techniques, a printed board is produced by contact bonding printed wiring boards together, making holes therein using a drill, and then laminating these boards. However, to meet the requirement for further higher density, printed boards are produced by a method where a heat-curable epoxy resin is used as the insulating layer, and after punching holes by a carbonic acid gas laser, the boards are subjected to laminated plating. This method, including punching holes by a laser, has a problem in that the size of the via hole cannot be reduced and the equipment is very expensive. Thus, an alternative method is being demanded. To satisfy this requirement, investigations have been made for a method where a fine pattern can be formed and an inexpensive photosensitive resin is used.

JPP-10-186656 discloses a photosensitive resin composition for use in the production of a multilayer wiring board, which mainly comprises a (meth)acrylate resin similar to the solder resist. However, an interlayer insulation film requires a higher water resistance, a higher hydrolysis resistance and a lower curing shrinkage in comparison with the solder resist, and therefore, it is difficult to simultaneously satisfy the requirements for both the productivity and the physical properties. To overcome this problem, a method using an epoxy resin as the main component, which provides a cured product having good physical properties, wherein a pattern is formed by photocationic curing, has been proposed (see, JPP-8-211610 and JPP-10-97068). However, the photocationic curing reaction of the epoxy resin proceeds slowly, and therefor a fine pattern cannot be formed by exposure to light in a short time.

As such, conventional photosensitive resins comprising a resin having a (meth)acrylate group as the main component and a photo-radical polymerization initiator cannot satisfy the requirement for highly functional cured product, whereas photosensitive resins comprising an epoxy resin as the main component which can be cured by cationic curing have a problem in that the photosensitivity is poor and a fine pattern cannot be formed, even though the cured product thereof has good physical properties.

In recent years, a radiation-sensitive resin composition for use in the insulating layer-forming material has become known (see, JPP-11-60683 and JPP-11-65116), in which a compound having an oxetane ring is used. However, this resin still cannot satisfy the productivity and the profitability requirements because an extended high-temperature treatment is necessary for obtaining a cured product, and also a heat cationic polymerization initiator must be used in a large amount.

U.S. Pat. No. 3,388,105 describes a technique of curing a compound having an oxetanyl group and an epoxy group within the same molecule by addition-reacting this compound with a carboxyl group-containing compound under heat. However, it is not known that this compound having an oxetanyl group and an epoxy group within the same molecule exhibits very high activity (curability) in the cationic ring-opening polymerization nor is it particularly suitable as a constituent component of a resist material which can be heat-treated within a short time and ensure excellent various properties.

DISCLOSURE OF THE INVENTION

The present invention has been made under these circumstances, and the object of the present invention is to provide a resist ink composition which can form an image by exposing it to an ultraviolet light for a short time, followed by development with an organic solvent or a dilute alkali aqueous solution. By a short time-heat treatment following the formation of a pattern, this composition can provide a solder resist or an interlayer insulation material excellent in various properties such as adhesive property, soldering resistance, pressure cooker test (PCT) durability and low water absorptivity.

As a result of extensive investigations to solve the above-described problems, the present inventors have found that these problems can be overcome by a specific photosensitive resin composition comprising a compound (a) having at least one oxetanyl group and at least one epoxy group within the same molecule. The present invention has been accomplished based on this finding.

More specifically, the present invention relates to a resist ink composition, a cured product thereof and a method for producing the cured product, as described in the following items [1] to [20].

[1] A resist ink composition comprising a compound (a) having at least one oxetanyl group and at least one epoxy group within the same molecule.

[2] A resist ink composition comprising a compound (a) having at least one oxetanyl group and at least one epoxy group within the same molecule, wherein said compound (a) is a compound represented by formula (1):

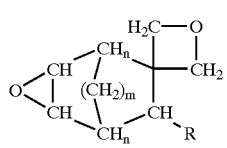

wherein R represents a hydrogen atom or a methyl group, m represents an integer of 0 to 2, and n is 2 when m is 0, and otherwise n is 1.

[3] A resist ink composition comprising a compound (a) having at least one oxetanyl group and at least one epoxy group within the same molecule, wherein said compound (a) is 7,8-epoxy-2-oxa-5-methylspiro[3.5]nonane and/or 6,7-epoxy-2-oxaspiro[3.5]nonane.

[4] The resist ink composition according to any one of [1] to [3], which contains a compound (b) capable of initiating cationic polymerization under irradiation of an active energy ray and/or under heat.

[5] The resist ink composition according to [4], wherein said compound (b) capable of initiating cationic polymerization under irradiation of an active energy ray and/or under heat is at least one selected from a sulfonium salt, an iodonium salt, phosphonium salt and a diazonium salt.

[6] The resist ink composition according to any one of [1] to [3], which contains a compound (c) having at least one epoxy group and not having an oxetanyl group.

[7] The resist ink composition according to any one of [1] to [3], which contains a compound (d) having at least one oxetanyl group and not having an epoxy group.

[8] The resist ink composition according to any one of [1] to [3], which contains a compound (e) having a radical polymerizable unsaturated group.

[9] The resist ink composition according to any one of [1] to [3], which contains a photo-radical polymerization initiator (f).

[10] The resist ink composition according to any one of [1] to [3], which contains (g) an alkali-soluble resin.

[11] The resist ink composition according to [10], wherein said alkali-soluble resin (g) is used in an amount of 50 to 2,000 parts by mass per 100 parts by mass of the compound (a) having at least one oxetanyl group and at least one epoxy group within the same molecule.

[12] A cured film obtained by curing the resist ink composition according to any one of [1] to [3].

[13] A solder resist cured film comprising the cured film according to [12].

[14] An interlayer insulation cured film for a multilayer interconnection board, comprising the cured film according to [12].

[15] A printed board comprising the cured film according to [12].

[16] A method for producing a cured film, wherein said method comprises curing a resist ink composition according to any of [1] to [3] under irradiation of an active energy ray and/or under heat.

[17] The method for producing the cured film according to [16], wherein said active energy ray is ultraviolet light.

[18] A resist ink composition comprising a compound (a) having at least one oxetanyl group and at least one epoxy group within the same molecule, a compound (b) capable of initiating cationic polymerization under irradiation of an active energy ray and/or under heat as well as a compound (c) having at least one epoxy group and not having an oxetanyl group.

[19] A resist ink composition comprising a compound (a) having at least one oxetanyl group and at least one epoxy group within the same molecule, a compound (b) capable of initiating cationic polymerization under irradiation of an active energy ray and/or under heat, a compound (c) having at least one epoxy group and not having an oxetanyl group as well as a compound (d) having at least one oxetanyl group and not having an epoxy group.

[20] A resist ink composition comprising a compound (a) having at least one oxetanyl group and at least one epoxy group within the same molecule, a compound (b) capable of initiating cationic polymerization under irradiation of an active energy ray and/or under heat, a compound (c) having at least one epoxy group and not having an oxetanyl group, a compound (d) having at least one oxetanyl group and not having an epoxy group, a compound (e) having a radical polymerizable unsaturated group as well as a photo-radical polymerization initiator (f).

BEST MODE FOR CARRYING OUT THE INVENTION

The present invention is described in detail below.

Examples of the compound (a) having at least one oxetanyl group and at least one epoxy group within the same molecule for use in the present invention include 3-ethyl-3-[(oxyranylmethoxy)methyl]oxetane, 7,8-epoxy-2-oxa-5-methyl-spiro[3.5]nonane, 6,7-epoxy-2-oxa-spiro[3.5]nonane, spiro[5,6-epoxynorbonane-2,3'-oxetane] and spiro [5,6-epoxy-3-methylnorbonane-2,3'-oxetane]. Among these, preferred are 7,8-epoxy-2-oxa-5-methyl-spiro[3.5]nonane and 6,7-epoxy-2-oxa-spiro[3.5]nonane.

These compounds having an oxetanyl group and an epoxy group within the same molecule can be easily synthesized by a known method and the synthesis method is described, for example, in U.S. Pat. No. 3,388,105.

These compounds (a) having at least one oxetanyl group and at least one epoxy group within the same molecule can be used individually or in combination of two or more thereof. The cured film formed of a resin composition containing a compound having an oxetanyl group within the molecule has low water absorptivity and therefore, exhibits good water resistance. Furthermore, by virtue of small degree of curing shrinkage, the cured film is favored with good adhesion and high dimensional stability of a pattern after the exposure and development.

The compound (b) capable of initiating cationic polymerization under irradiation of an active energy ray and/or under heat may be a compound which is subjected to a conversion under heat or irradiation of an active energy ray such as ultraviolet light, and thereby generates a substance capable of initiating cationic polymerization, such as an acid.

Accordingly, the compound (b) is one of a cationic polymerization initiator and is called an "acid generator" in the art. In the present invention, the compound (b) is hereinafter referred to as an "acid generation-type cationic polymerization initiator".

The acid generation-type cationic polymerization initiator is blended to accelerate the ring-opening cationic polymerization of those two groups of the compound (a) having at least one oxetanyl group and at least one epoxy group within the same molecule, and to allow smooth curing of the cured product or film to proceed.

The acid generation-type cationic polymerization initiator as used in the present invention is a compound which is subjected to a conversion under heat or irradiation of an active energy ray such as ultraviolet light and thereby generates a substance capable of initiating cationic polymerization, such as an acid. Accordingly, compounds originally in an acid form, such as carboxylic acid, are excluded.

Examples of the acid generation-type cationic polymerization initiator includes known sulfonium salts, iodonium salts, phosphonium salts, diazonium salts, ammonium salts and ferrocenes. Specific examples thereof are described below, however, the acid generation-type cationic polymerization initiator is not limited to these compounds.

Examples of the sulfonium salt-based acid generation-type cationic polymerization initiator include bis[4-(diphenylsulfonio)phenyl]sulfide bishexafluorophosphate, bis[4-(diphenylsulfonio)phenyl]sulfide bishexafluoroantimonate, bis[4-(diphenylsulfonio)phenyl]sulfide bistetrafluoroborate, bis[4-(diphenylsulfonio)phenyl]-sulfide tetrakis(pentafluorophenyl)borate, diphenyl-4-(phenylthio)phenylsulfonium hexafluorophosphate, diphenyl-4-(phenylthio)phenylsulfonium hexafluoroantimonate, diphenyl-4-(phenylthio)phenylsulfonium tetrafluoroborate, diphenyl-4-(phenylthio)phenylsulfonium tetrakis(pentafluorophenyl)borate, triphenylsulfonium hexafluorophosphate, triphenylsulfonium hexafluoroantimonate, triphenylsulfonium tetrafluoroborate, triphenylsulfonium tetrakis (pentafluorophenyl)borate, bis[4-(di(4-(2-hydroxyethoxy))phenylsulfonio)phenyl]sulfide bishexafluorophosphate, bis[4-(di(4-(2-hydroxyethoxy))phenylsulfonio)phenyl]sulfide bishexafluoroantimonate, bis[4-(di(4-(2-hydroxyethoxy))phenylsulfonio)phenyl]sulfide bistetrafluoroborate and bis[4-(di(4-(2-hydroxyethoxy))phenylsulfonio)phenyl]sulfide tetrakis (pentafluorophenyl)borate.

Examples of the iodonium salt-based acid generation-type cationic polymerization initiator include diphenyl-iodonium hexafluorophosphate, diphenyliodonium hexafluoroantimonate, diphenyliodonium tetrafluoroborate, diphenyliodonium tetrakis(pentafluorophenyl)borate, bis(dodecylphenyl)iodonium hexafluorophosphate, bis(dodecylphenyl)iodonium hexafluoroantimonate, bis(dodecylphenyl)iodonium tetrafluoroborate, bis(dodecylphenyl)iodonium tetrakis(pentafluorophenyl)borate, 4-methylphenyl-4-(1-methylethyl)phenyliodonium hexafluorophosphate, 4-methylphenyl-4-(1-methylethyl)phenyliodonium hexafluoroantimonate, 4-methylphenyl-4-(1-methylethyl)phenyliodonium tetrafluoroborate and 4-methylphenyl-4-(1-methylethyl)phenyliodonium tetrakis (pentafluorophenyl)borate.

Examples of the phosphonium salt-based acid generation-type cationic polymerization initiator include ethyltriphenyl phosphonium tetrafluoroborate, ethyltriphenyl phosphonium hexafluorophosphate, ethyltriphenyl phosphonium hexafluoroantimonate, tetrabutyl phosphonium tetrafluoroborate, tetrabutyl phosphonium hexafluorophosphate, tetrabutyl phosphonium hexafluoroantimonate.

Examples of the diazonium salt-based acid generation-type cationic polymerization initiator include phenyldiazonium hexafluorophosphate, phenyldiazonium hexafluoroantimonate, phenyldiazonium tetrafluoroborate and phenyldiazonium tetrakis(pentafluorophenyl)borate.

Examples of the ammonium salt-based acid generation-type cationic polymerization initiator include 1-benzyl-2-cyanopyridium hexafluorophosphate, 1-benzyl-2-cyanopyridium hexafluoroantimonate, 1-benzyl-2-cyanopyridium tetra-fluoroborate, 1-benzyl-2-cyanopyridium tetrakis(pentafluorophenyl)borate, 1-(naphthylmethyl)-2-cyanopyridium hexafluorophosphate, 1-(naphthylmethyl)-2-cyanopyridium hexafluoroantimonate, 1-(naphthylmethyl)-2-cyanopyridium tetrafluoroborate and 1-(naphthylmethyl)-2-cyanopyridium tetrakis(pentafluorophenyl)borate.

Examples of the ferrocene-based acid generation-type cationic polymerization initiator include (2,4-cyclopentadien-1-yl)[(1-methylethyl)benzene-Fe(II) hexafluoro-phosphate, (2,4-cyclopentadien-1-yl)[(1-methylethyl)-benzene]-Fe(II) hexafluoroantimonate, (2,4-cyclopentadien-1-yl)[(1-methylethyl)benzene]-Fe(II) tetrafluoroborate and (2,4-cyclopentadien-1-yl)[(1-methylethyl)benzene]-Fe(II) tetrakis(pentafluorophenyl) borate.

Among these acid generation-type cationic polymerization initiators, sulfonium salt-based and iodonium salt-based initiators are preferred in view of the curing rate, stability and profitability. Examples of the commercially available product include SP-150, SP-170, CP-66 and CP-77 produced by Asahi Denka Kogyo; CYRACURE-UVI-6990 and UVI-6974 produced by Union Carbide; CI-2855 and CI-2639 produced by Nippon Soda; San-Aid SI-60 produced by Sanshin Kagaku Kogyo; IRGACURE 261 (2,4-cyclopentadien-1-yl)[(1-methylethyl)benzene]-Fe(II) hexafluorophosphate) and RHODORSIL 2074 produced by Ciba Specialty Chemicals; and 4-methylphenyl-4-(1-methylethyl)phenyliodonium tetrakis(pentafluorophenyl) borate produced by Rhone Poulenc.

The acid generation-type cationic polymerization initiator may be selected from the above-described materials and used solely, or two or more thereof may be used in combination. The suitable range of the amount of the acid generation-type cationic polymerization initiator being used is not critical, but is preferably from 0.05 to 25 parts by mass, more preferably from 1 to 20 parts by mass, per 100 parts by mass of the blended amount of the compound (a) having at least one oxetanyl group and at least one epoxy group within the same molecule (in the case where a compound capable of cationic polymerization, such as a compound having an epoxy group described below, is used in combination, the total amount of these compounds). If the amount added is less than 0.05 parts by mass, poor sensitivity results and a tremendously large light irradiation energy or a high-temperature treatment for a long time is necessary until the curing is completed. Furthermore, even though adding it in an amount exceeding 25 parts by mass, the sensitivity will often not increase, and this is not preferred also in view of the profitability. On the contrary, the amount of the initiator remaining in the film as an uncured component increases and the physical properties of the cured product may deteriorate.

The compound (c) having at least one epoxy group and not having an oxetanyl group within the molecule for use in the present invention may be a commonly known epoxy compound. When the epoxy compound is added to the resist ink composition of the present invention, the cured film obtained can be more improved in terms of heat resistance and chemical resistance. This epoxy compound is not particularly limited as long as it has at least one epoxy group within one molecule.

Specific examples thereof, which can be used, include bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, epoxy novolak resin, hydrogenated bisphenol A diglycidyl ether, hydrogenated bisphenol F diglycidyl ether, hydrogenated bisphenol S diglycidyl ether, cresol novolak epoxy resin and triglycidyl isocyanurate.

Examples of the aliphatic epoxy compound include (3,4-epoxycyclohexyl)methyl-3',4'-epoxycyclohexyl carboxylate, 2-(3,4-epoxycyclohexyl-5,5-spiro-3,4-epoxy)-cyclohexane-meta-dioxane, bis(3,4-epoxycyclohexylmethyl) adipate, vinylcyclohexene oxide, 4-vinylepoxycyclohexane, bis(3,4-epoxy-6-methylcyclohexylmethyl)adipate, 3,4-epoxy-6-methylcyclohexyl-3',4'-epoxy-6'-methylcyclohexane carboxylate, methylenebis(3,4-epoxycyclohexane), dicyclopentadiene diepoxide, di(3,4-epoxycyclohexylmethyl) ether of ethylene glycol, and ethylenebis(3,4-epoxycyclohexane carboxylate).

Other examples include dioctyl epoxy hexahydrophthalate, di-2-ethylhexyl epoxy hexahydrophthalate, 1,4-butanedioldiglycidyl ether, 1,6-hexanedioldiglycidyl ether, glycerol triglycidyl ether, trimethylolpropane triglycidyl ether, polyethylene glycol diglycidyl ether, polypropylene glycol diglycidyl ether; polyglycidyl ethers of a polyether polyol obtained by adding one or more alkylene oxide to an aliphatic polyhydric alcohol, such as ethylene glycol, propylene glycol and glycerol; diglycidyl ethers of aliphatic long-chained dibasic acid; monoglycidyl ethers of aliphatic higher alcohol; butyl glycidyl ether, phenyl glycidyl ether, cresol glycidyl ether, nonylphenyl glycidyl ether, glycidyl methacrylate; monoglycidyl ethers of phenol, cresol, butylphenol or polyether alcohol obtained by adding an alkylene oxide thereto; glycidyl esters of higher aliphatic acid; epoxidated soybean oil; butyl epoxystearate, octyl epoxystearate, epoxidated linseed oil and epoxidated polybutadiene.

These compounds (c) having at least one epoxy group and not having an oxetanyl group within the molecule can be used individually or in combination of two or more thereof.

In the case of using the compound (c), the amount of the compound (c) blended (in the case of using two or more in combination, the total amount thereof) is preferably from 5 to 1,000 parts by mass, more preferably from 10 to 500 parts by mass, per 100 parts by mass of the compound (a) herein having at least one oxetanyl group and at least one epoxy group within the same molecule.

In order to adjust the viscosity of the entire composition, to improve the water resistance or to reduce the curing shrinkage, a compound (d) having at least one oxetanyl group and not having an epoxy group may be added to the resist ink composition of the present invention within the range of not impairing the object of the present invention.

Specific examples of the compound (d) include trimethylene oxide, 3,3-dimethyloxetane, 3,3-bis(chloromethyl) oxetane, 3-ethyl-3-phenoxymethyloxetane, 3-ethyl-3-hydroxymethyloxetane (EOXA, trade name, produced by Toa Gosei), bis[(3-ethyl-3-oxetanylmethoxy)methyl] benzene (also called xylylene dioxetane; XDO, trade name, produced by Toa Gosei), tri[(3-ethyl-3-oxetanylmethoxy) methyl]benzene, bis[(3-ethyl-3-oxetanylmethoxy) methylphenyl]ether, (3-ethyl-3-oxetanylmethoxy) oligodimethylsiloxane, and compounds containing a plurality of oxetane rings having a high molecular mass, specifically, oxetane oligomer (Oligo-OXT, trade name, produced by Toa Gosei), 2-oxaspiro[3.5]nonane, 7-methyl-2-oxaspiro[3.5]nonane, spiro[adamantane-2,3'-oxetane], spiro[bicyclo[2.2.1]heptane-2,3'-oxetane], spiro[bicyclo[2.2.2]octane-2,3,-oxetane], spiro[7-oxabicyclo[2.2.1] heptane-2,3'-oxetane], 2-oxaspiro[3.5]non-6-ene, 5-methyl-2-oxaspiro[3.5]non-6-ene, spiro[bicyclo[2.2.1]hept-5-ene-2, 3'-oxetane], spiro[3-methylbicyclo[2.2.1]hept-5-ene-2,3'-oxetane], 5-methyl-2-oxaspiro[3.5]nonane and spiro[3-methylbicyclo[2.2.1]heptane-2,3'-oxetane.

These compounds (d) can be used individually or as a mixture of two or more thereof.

In the case of using the compound (d), the amount of the compound (d) blended is preferably from 5 to 200 parts by mass, more preferably from 10 to 100 parts by mass, per 100 parts by mass of the compound (a) herein having at least one oxetanyl group and at least one epoxy group within the same molecule. If the amount added exceeds 200 parts by mass, the dry touch feeling will deteriorate and the quality of the cured film will be disadvantageously liable to decrease in terms of resolution, heat resistance and PCT durability.

In the present invention, a cationic polymerizable monomer described below can also be added to the resist ink composition. The cationic polymerizable monomer is a compound of causing a polymerization initiating reaction or a crosslinking reaction due to an acid generated by the acid generation-type cationic polymerization initiator and is classified into a compound other than the compounds (a), (c) and (d). Examples thereof include oxolane compounds such as tetrahydrofuran and 2,3-dimethyltetrahydrofuran; cyclic acetal compounds such as trioxane, 1,3-dioxolane and 1,3,6-trioxanecyclooctane; cyclic lactone compounds such as β-propiolactone and ε-caprolactone; thiirane compounds such as ethylene sulfide, 1,2-propylene sulfide and thioepichlorohydrin; thiethane compounds such as 3,3-dimethylthietane; vinyl ether compounds such as ethylene glycol divinyl ether, triethylene glycol divinyl ether and trimethylolpropane trivinyl ether; spiroorthoester compounds which are a reaction product of an epoxy compound and a lactone; ethylenically unsaturated compounds such as vinylcyclohexane, isobutylene and polybutadiene; cyclic ether compounds; cyclic thioether compounds; and vinyl compounds.

One of these cationic polymerizable monomers may be added alone or two or more thereof may be added in combination.

As compound (e) having a radical polymerizable unsaturated group may also be added to the resist ink composition of the present invention within the range of not impairing the object of the present invention, so as to improve the photocurability (active energy ray-curability). The compound (e) is not critical, however, a commonly known and used radical polymerizable monomer of (meth)acrylic acid ester type can be used. Specific examples thereof include monofunctional (meth)acrylate compounds such as methyl (meth)acrylate, ethyl meth(acrylate, n-propyl (meth)acrylate, n-butyl (meth) acrylate, 2-ethylhexyl (meth)acrylate, lauryl (meth)acrylate, cyclohexyl (meth)acrylate, phenoxyethyl (meth)acrylate, 2-ethoxyethyl (meth)acrylate, glycidyl (meth)acrylate, 2-hydroxyethyl (meth)acrylate, benzyl (meth)acrylate and ethylene glycol mono(meth)acrylate; ethylene glycol di(meth)acrylate, polyethylene glycol di(meth)acrylate, trimethylolpropane tri(meth)acrylate, pentaerythritol tetra(meth)acrylate, dipentaerythritol penta(meth)acrylate, polyfunctional epoxy (meth)acrylate resin and polyfunctional urethane (meth)acrylate resin.

In the case of using the compound (e), the amount of the compound (e) added is preferably from 5 to 500 parts by mass, more preferably from 10 to 200 parts by mass, per 100 parts by mass of the compound (a) herein having at least one oxetanyl group and at least one epoxy group within the same molecule. If the amount added exceeds 500 parts by mass, the dry touch feeling will often deteriorate. Furthermore, in the film formation, higher ratio of crosslinked (meth)acryl groups would be required, and thereby the quality of the cured film obtained is liable to decrease in terms of heat resistance and PCT durability.

The photo-radical initiator (f) used to promote smooth radical polymerization of the compound having a radical polymerizable unsaturated group may be a known and commonly used compound which generates a radical in response to light. The term "light" as used herein means a radiant such as visible ray, ultraviolet light, far ultraviolet light, X ray and electron beam, etc. Examples of the photo-radical initiator (f) include benzoin, benzoin ethyl ether, benzoin isopropyl ether, benzoin-n-butyl ether, benzoin isobutyl ether, acetophenone, dimethylaminoacetophenone, 2,2-dimethoxy-2-phenylacetophenone, 2,2-diethoxy-2-phenylacetophenone, 2-hydroxy-2-methyl-1-phenylpropan-1-one, 1-hydroxycyclohexyl phenyl ketone, 2-methyl-1-[4-(methylthio)phenyl]-2-morpholinopropan-1-one(Irgacure 907, produced by Ciba Specialty Chemicals), 4-(2-hydroxyethoxy)phenyl-2-(hydroxy-2-propyl) ketone, benzophenone, p-phenylbenzophenone, 4,4'-diethylaminobenzophenone, dichlorobenzophenone, 2-methylanthraquinone, 2-t-butylanthraquinone, 2-aminoanthraquinone, 2-methylthioxanthone, 2-ethylthioxanthone, 2-chlorothioxanthone, 2,4-diethylthioxanthone, benzyl dimethyl ketal, p-dimethylaminebenzoic acid ester, 2,4,6-trimethylbenzoyldiphenyl phosphine oxide (LUCIRIN TPO, produced by BASF), bis(2,6-dimethoxybenzoyl)-2,4,4-trimethyl-pentyl-phosphine oxide-containing initiator (Irgacure 1700, 149, 1800, produced Ciba Specialty Chemicals) and bis(2,4,6-trimethylbenzoyl)phenyl-phosphine oxide (Irgacure 819, produced by Ciba Specialty Chemicals). These can be used individually or in combination of two or more thereof.

In the case of using the photo-radical initiator (f), the amount of the photo-radical initiator (f) used is preferably from 0.007 to 0.5 mol, more preferably from 0.035 to 0.3 mol, based on 1 equivalent amount of the total (meth)acrylic groups in the compound (e) having a radical polymerizable unsaturated group and in the optional alkali-soluble resin (g) described below having a (meth)acryl group contained in the composition. If the amount of the photo-radical initiator added is less than 0.007 mol, poor sensitivity may result, whereas even if the photo-radical initiator is added in excess of 0.5 mol, the sensitivity would often not increase, and this is also not preferred in view of the profitability.

In the case where the resist ink composition of the present invention is used in a solder-resist or an insulating film for a multilayer printed wiring board, when the pattern following exposure is developed with an alkali aqueous solution, an alkali-soluble resin (g) may be used in the resist ink composition. The alkali-soluble resin (g) is not critical as long as it is soluble in an alkali aqueous solution, is compatible with the compounds (a) and (b), and can form a film. Specific examples thereof include vinyl phenol polymers, copolymers of a vinyl phenol with another monomer having a copolymerizable double bond (for example, esters such as methyl (meth)acrylate and hydroxyethyl (meth)acrylate; acid amides such as (meth)acrylamide; acrylonitrile; and styrene), novolak resins, a polycondensation product of phenols and aldehydes, a partial hydrogenated product of these resins, and copolymers of an acrylic acid with another monomer having a copolymerizable double bond (for example, esters such as methyl (meth)acrylate and hydroxyethyl (meth)acrylate; acid amides such as (meth)acrylamide; acrylonitrile; and styrene).

To this alkali-soluble resin, a radical polymerizable group may be imparted. The resin imparted with a radical polymerizable group can be a known material and specific examples thereof include resins described in JPP-3-71137, JPP-9-136942 and JPP-10-274849, obtained by reacting an unsaturated monocarboxylic acid such as acrylic acid with a part of epoxy groups of a novolak-type epoxy resin and subsequently reacting therewith a polybasic acid anhydride, resins described in JPP-11-24254, obtained by reacting a (meth)acrylic acid with a part of epoxy groups of a polyfunctional epoxy resin, further reacting therewith a polybasic acid anhydride, and reacting the resulted carboxyl group with a glycidyl (meth)acrylate and resins obtained by adding a glycidyl (meth)acrylate to a part of hydroxyl groups of phenol resin, novolak phenol resin or phenoxy resin by a conventional method. These alkali-soluble resins may be used individually or in combination of two or more thereof.

In the case of using the alkali-soluble resin (g), the amount of the alkali-soluble resin (g) used is preferably from 50 to 2,000 parts by mass, more preferably from 100 to 1,000 parts by mass, per 100 parts by mass of the compound (a) herein having at least one oxetanyl group and at least one epoxy group within the same molecule. If the amount added is less than 50 parts by mass, a sufficiently high alkali solubility cannot be obtained and bad developability results in many cases, whereas if it exceeds 2,000 parts by mass, the crosslinking density decreases and the quality of the resulting cured film is advantageously reduced in terms of heat resistance and PCT durability.

The resist ink composition of the present invention may be solventless, however, it is also possible to add a solvent as a viscosity adjusting agent so as to form a uniform film. Specific examples of the solvent include ethylene glycol monoalkyl ethers or acetates thereof; diethylene glycol mono- or dialkyl ethers; propylene glycol monoalkyl ethers or acetates thereof; known organic solvents such as dipropylene glycol mono- or dialkyl ethers; methyl carbitol, butyl carbitol, butyl cellosolve acetate, carbitol acetate, ethyl methyl ketone, cyclohexane, toluene, xylene, tetramethylbenzene, petroleum ether, petroleum naphtha and solvent naphtha; or additives and solvents well-known in this technical field, such as plasticizer. These can be used individually or in combination of two or more thereof.

In the case of using a solvent, the amount of the solvent added is from 0 to 2,000 parts by mass per 100 parts by mass, based on the entire amounts of the resist ink composition without the solvent. The amount can be appropriately selected according to the coating method.

For the purpose of improving the properties such as adhesive property and hardness, the resist ink composition of the present invention may further contain, if desired, a commonly known and used inorganic filler such as barium sulfate, barium titanate, silicon oxide powder, fine particulate silicon oxide, amorphous silica, talc, clay, magnesium carbonate, calcium carbonate, aluminum oxide, aluminum hydroxide and mica powder. The amount of the filler used is preferably from 0 to 150 parts by mass, more preferably from 10 to 100 parts by mass, based on the entire amount of the resist ink composition.

In polymerizing the polymerizable resist ink composition of the present invention using an ultraviolet light which is an active energy rays, a sensitizer may be used so as to improve the polymerization rate. Examples of the sensitizer used to this purpose include pyrene, perylene, 2,4-diethylthioxanthone, 2,4-dimethylthioxanthone, 2,4-dichlorothioxanthone and phenothiazine. In the case of using a sensitizer in combination, the amount of the sensitizer used is preferably from 0.1 to 100 parts by mass per 100 parts by mass of the photoacid generation-type cationic polymerization initiator.

Furthermore, if desired, commonly known and used additives including a colorant such as Phthalocyanine Blue, Phthalocyanine Green, Iodine Green, Disazo Yellow, Crystal Violet, titanium oxide, carbon black and naphthalene black; a silicone-based, fluorine-based or polymer-based defoaming agent; a leveling agent; and an adhesion-imparting agent such as imidazole-based, thiazole-based, triazole-based or silane coupling agent, may also be used.

The resist ink composition of the present invention may further comprises an ion exchanger in order to remove any acid component which remains after curing. Such an ion exchanger includes Amberlite CG 120 (produced by Organo), Tomix AD 500, 600 (produced by Tomita Pharmaceutical Co. Ltd.), Kyoward 500, 600 (produced by Kyowa Kagaku), IXE-500, 600, 633, 700, 1100, 1320 (produced by Toa Gosei Kagaku). This ion exchanger may be used in an amount of 0.5 to 12 parts by mass, preferably 1 to 8 parts by mass per 1 part by mass of the acid generation-type cationic polymerization initiator. This ion exchanger prevents the corrosion of the copper wire or the like due to the existence of an acid component remaining after curing.

The resist ink composition of the present invention can be obtained by mixing the constituent substances described above, such as compound (a) and compound (b), in a commonly known and used mixing apparatus. The mixing apparatus is not critical as long as it is an apparatus which can uniformly mixing respective constituent substances, however, it should be selected based on the viscosity and the like of the composition.

Examples of the method for obtaining a solder-resist cured film or an insulating cured film for a multilayer printed wiring board using the resist ink composition of the present invention include the following methods. That is, the composition of the present invention is coated on a printed wiring board to a thickness of 10 to 200 µm by a screen printing method, a spray method, a roll coating method, an electrostatic coating method or a curtain coating method, the coating is dried at 60 to 100° C. for 5 to 60 minutes, a negative film is directly contacted with the coating, an ultraviolet ray is irradiated thereon, the unexposed area is dissolved and removed using an organic solvent (e.g., butyl cellosolve acetate) or a dilute alkali aqueous solution (e.g., sodium hydroxide, potassium hydroxide, sodium carbonate, sodium silicate, ammonia, triethylamine, tetramethylammonium hydroxide), and thereafter, in order to improve various physical properties, the coating is cured under heating at 150° C. for 20 to 180 minutes to obtain a cured film. If desired, an ultraviolet ray may be irradiated before and after the final heating.

The resist ink composition of the present invention can be polymerized (cured) under irradiation of an active energy ray and/or under heat. The active energy ray as used herein means ultraviolet light, X ray, electron beam, γ ray or the like. Examples of the light source used for irradiating an ultraviolet light include metal halide lamp, mercury arc lamp, xenon arc lamp, fluorescent lamp, carbon arc lamp, tungsten-halogen duplicate lamp and sunlight.

EXAMPLES

The present invention is described in greater detail below by referring to the Examples, however, the present invention should not be construed as being limited thereto. Unless otherwise indicated, the term "parts" in the Examples and Comparative Examples indicates "parts by mass".

Among the materials used in the Examples and Comparative Examples, the commercially available products shown below were used as they are without passing through purification.

XDO: 1,4-bis[(3-ethyl-3-oxetanylmethoxy)methyl]benzene, produced by Toa Gosei

UVI-6990: light cationic polymerization initiator, produced by Union Carbide

EOCN-104S: phenol novolak-type epoxy resin, produced by Nippon Kayaku

EPPN-201: phenol novolak-type epoxy resin, produced by Nippon Kayaku

ARONICS M-305: pentaerythritol triacrylate, produced by Toa Gosei

MALCALINKER M: alkali-soluble resin, produced by Maruzene Sekiyu Kagaku, mass average molecular mass: 8,000

IRGACURE 907: photopolymerization initiator, produced by Ciba Specialty Chemicals DETX-S: diethylthioxanthone, photosensitizer, produced by Nippon Kayaku Cyanine Green: colorant, produced by Dainichi Seika TSA-705S: defoaming agent, produced by Toshiba Silicone The compounds used, which are not commercially available, were chemically synthesized by the present inventors. That is, 7,8-epoxy-2-oxa-5-methylspiro[3.5]nonane and 6,7-epoxy-2-oxaspiro[3.5]nonane were synthesized by the present inventors with reference to U.S. Pat. No. 3,388, 105. In particular, 7,8-epoxy-2-oxa-5-methylspiro[3.5] nonane was synthesized as below:

Synthesis of 7,8-epoxy-2-oxa-5-methylspiro [3.5]nonane

1) Synthesis of 6-methyl-3-cyclohexene-1,1-dimethanol

To a three-necked flask, 327 g of 2-methyl-4-cyclohexene-1-carboaldehyde, a Diels-Alder reaction product of butadiene and crotonaldehyde, 600 ml of methanol and 729 g of 37% of formalin were charged, and then the temperature of this solution was raised to 60° C. with stirring. Next, 252 g of KOH dissolved in 600 ml of distilled water was added dropwise thereto. After stirring for 7 hours, the reaction solution was concentrated under reduced pressure, which resulted in a residue with two phases. The oil phase concentrated to about 150 ml was washed with 300 ml of distilled water. After concentration under reduced pressure, 50 mg of 3,5-di(t-butyl)-4-hydroxytoluene (BHT) was added to the oil phase, and then vacuum distillation was carried out to yield 311 g (yield 82%) of 6-methyl-3-cyclohexene-1,1-dimethanol as a colorless crystal.

2) Synthesis of 6-methyl-3-cyclohexene-1,1-dimethanol cyclic carbonate ester

To a three-necked flask, 310 g (1.99 mol) of 6-methyl-3-cyclohexene-1,1-dimethanol, 894 g of dimethylcarbonate (DMC) and 0.93 g of potassium carbonate were charged, and it was refluxed at a temperature raised to 90° C. for 4 hours. The reaction solution was cooled to room temperature, and potassium carbonate was filtered off. After adding 120 mg of BHT, the remaining DMC and methanol were removed at a reduced pressure of 2 kPa (15 mmHg), and then vacuum distillation was carried out to yield 326 g (yield 89.4%) of 6-methyl-3-cyclohexene-1,1-dimethanol cyclic carbonate ester, which is in a form of a colorless crystal at room temperature.

3) Synthesis of 2-oxa-9-methylspiro(3.5)non-6-ene

To a three-necked flask, 321.15 g of 6-methyl-3-cyclohexene-1,1-dimethanol cyclic carbonate ester, 642 mg (0.2 mass %) of BHT, 1.93 g of LiCl were charged, and then stirred with heating at 275° C. using a mantle heater. The reaction product immediately drained out of the reaction system at a reduced pressure of about 8 kPa (60 mmHg), and heating was continued until no efflux therefrom was observed. 600 mg of BHT was added to the product, and then vacuum distillation was carried out to yield 187 g (yield 71%) of 2-oxa-9-methylspiro[3.5]non-6-ene as a transparent and colorless solution.

4) Synthesis of 7,8-epoxy-2-oxa-5-methylspiro[3.5]nonane 50 g of 2-oxa-9-methylspiro[3.5]non-6-ene was dissolved in 150 ml of dichloromethane, and charged into a reaction vessel. 93.7 g of m-chloroperbenzoic acid suspended in 400 ml of dichloromethane was added dropwise over 1 hour, while keeping the temperature of the reaction solution under 40° C. The crystallized m-chlorobenzoic acid was filtered off, and washed thoroughly with cold dichloromethane. 15.0 g of potassium hydroxide was charged to the organic phase, and after 30 minutes, the crystallized crystal was filtered off, and washed with cold dichloromethane. The organic phase was washed with 5% of aqueous $NaHSO_4$, saturated saline, followed by concentration, to yield 38.1 g (yield 73.7%) of 7,8-epoxy-2-oxa-5-methylspiro[3.5]nonane as a colorless solid form.

6,7-epoxy-2-oxaspiro[3.5]nonane was also synthesized by the present inventors with a similar procedure to the above.

5-Methyl-2-oxaspiro[3.5]none was synthesized as follows.

Synthesis of 5-Methyl-2-oxaspiro[3.5]none

Into a 1 L-volume three-necked flask, 474 g of 2-methyl-cyclohexane-1,1-dimethanol, 405 g of dimethyl carbonate, 1.4 g of potassium carbonate and 0.95 g of BHT were charged. The mixture was stirred under heating at 100° C. in an oil bath and while distilling off the generated methanol out of the system, the reaction was performed for 14 hours. Finally, the pressure in the inside of the reactor was reduced to 10 mmHg, as a result, a corresponding carbonic ester was obtained in a yield of 95%.

The obtained cyclic carbonic ester was stirred under heating at 250° C. and while discharging the generated carbonic acid gas out of the system through the top of the cooling unit, the reaction was performed for 10 hours. This reaction solution was purified by distillation to obtain 230 g of 5-methyl-2-oxaspiro[3.5]nonane.

An alkali-soluble resin was synthesized by the present inventors according to the method described in JPP-3-71137. An example is described below.

Production Example of Alkali-Soluble Resin

Using 30% by mass of butyl cellosolve acetate as the solvent, acrylic acid was reacted with cresol novolak-type resin (EOCN-104S, produced by Nippon Kayaku) in a ratio of 1 mol: 1 epoxy equivalent by a conventional method to obtain epoxy acrylate. To 1 hydroxyl group equivalent of this epoxy acrylate, 0.5 mol of tetrahydrophthalic acid anhydride was reacted until the acid value reached the theoretical value. The resulting resin was designated as Alkali-Soluble Resin (A).

Manufacture of Cured Film

A resist ink composition was coated by a screen printing method on a 1.6 mm-thick degrease-cleaned copper-lined laminate sheet, and after pre-drying the coating at 80° C. for 20 minutes, a negative mask (Contact Control Guide, C-3, produced by Kodak) was adhered to the coated surface and then irradiated with a one-pass irradiation of an ultraviolet ray of 400 $mJ/cm^2$ using a belt conveyer having mounted thereon a metal halide lamp of 120 W/cm (UVC-302/1MN:302/5XX-DX01, manufactured by Ushio Denki K.K.). Subsequently, a developer was sprayed on the coated surface at a spray pressure of 2.0 $kg/cm^2$ for 60 seconds to remove the uncured area of the coating and thereby form a pattern (development). The developer was butyl cellosolve acetate for Examples 1 and 2 and an aqueous 1 mass % sodium carbonate solution for Examples 3 to 7 and Comparative Example 2. Thereafter, the coating was post-cured at 150° C. for 20 minutes in a hot air circulation-type drying furnace to obtain a cured film. The cured film was tested on the following items.

Evaluation of Capabilities of Cured Film

The films obtained by curing the resist ink compositions of the present invention are evaluated for their performances (resolution, adhesive property, solder resistance, pressure cooker test (PCT)) as follows.

1) Evaluation of Resolution

A 100-μm pattern transferred from the negative mask (Contact Control Guide C-3, produced by Kodak) was examined by microscopy (magnification: 20 to 100 times).

Evaluation:
  ○: The pattern did not peel off and the boundary between line and space is clear.
  X: The pattern peeled off and the boundary between line and space is unclear.

2) Adhesive Property Test

According to JIS D0202, check-pattern crosscuts were provided to the cured film, and then subjected to a peeling test using a Cellophane tape. The peeled state of the cured film was examined visually by counting the number of peeled square-pieces per 100 square-pieces.

Evaluation:
  ○: 100/100 (absolutely no change)
  X: 0/100 to 99/100

3) Test of Solder Resistance

According to JIS C6481, an operation consisted of dipping the cured film in a soldering bath at 260° C. for 15 seconds, pulling out and cooling the film was repeated three times. Thereafter, the state of the cured film and the adhesion to the substrate were totally evaluated.

Evaluation:
  ⊚: Absolutely no change
  ○: Slight change
  Δ: Significant change
  X: Cured film with swelling or swelling and peeling 4) Pressure Cooker Test (PCT) Durability A substrate having formed thereon a cured film was placed in an autoclave (MODEL SS-240, manufactured by Tomy Seikosha), allowed to stand at 121° C. and 2 atm under a saturated condition of 100% relative humidity for 10 hours, taken out and then subjected to the peeling test with a Cellophane tape. Thereafter, the peeled state was examined visually.

Example 1

33 parts of 7,8-epoxy-2-oxa-5-methylspiro[3.5]nonane, 1.5 parts of UVI-6990, 0.5 parts of DETX-S, 16 parts of talc, 0.5 parts of Cyanine Green, 0.5 parts of TSA-705S and 48 parts of butyl cellosolve acetate were blended and kneaded in a roll mill to prepare a resist ink composition. After forming a film using the composition, the resolution was evaluated. As a result, it was confirmed that the 100-$\mu$m pattern did not peel off and the boundary between line and space was clear.

Comparative Example 1

An operation exactly the same as in Example 1 was performed except for using 33 parts of XDO which is an oxetane compound not containing an epoxy group, in place of 33 parts of 7,8-epoxy-2-oxa-5-methylspiro[3.5]nonane. The 100 $\mu$m pattern was examined by microscopy. As a result, it was confirmed that a part of the pattern peeled off, the boundary between line and space was unclear and the resolution at 100 $\mu$m was not sufficiently high.

In comparison with Example 1 using the resist ink composition of the present invention, it could be seen that the present invention exhibits superior resolution under the same film forming conditions.

Example 2

An operation exactly the same as in Example 1 was performed except for changing the amount of 7,8-epoxy-2-oxa-5-methylspiro[3.5]nonane from 33 parts to 20 parts and further adding 13 parts of EPPN-201 which is an epoxy resin. In the evaluation of resolution, the 100-$\mu$m pattern did not peel off and the boundary between line and space was clear, revealing that the resolution was high.

Example 3

An operation exactly the same as in Example 2 was performed except for changing the amount of 7,8-epoxy-2-oxa-5-methylspiro[3.5]nonane from 20 parts to 10 parts, changing the amount of EPPN-201 from 12 parts to 10 parts, and further adding 10 parts of MALCALINKER M which is an alkali-soluble resin, to prepare a resist ink composition. In the film formation, development with a dilute alkali water could be performed. In the evaluation of resolution, the 100-$\mu$m pattern did not peel off and the boundary between line and space was clear, revealing that the resolution was high.

Examples 4 to 7

The components shown in Table 1 were blended and kneaded in a roll mill to prepare resist compositions. In the Table, the numerical value shows the parts by mass. After forming a film, tests of resolution, adhesion, solder resistance and pressure cooker test (PCT) durability were performed. The results are shown together in Table 1.

Comparative Example 2

The components shown in Table 1 were blended and an operation exactly the same as in Example 4 was performed. The results are shown in Table 1.

In comparison with Example 7 using the resist ink composition of the present invention, it could be seen that the adhesive property and the solder resistance are on the same level but in the PCT durability, Example 7 exhibits particularly superior physical properties.

TABLE 1

| Resist Ink Composition (parts by mass) | | Example 4 | Example 5 | Example 6 | Example 7 | Comparative Example 2 |
|---|---|---|---|---|---|---|
| Compound (a) | 7,8-epoxy-2-oxa-5-methylspiro[3.5]-nonane | 8 | 4 | | 4 | |
| Compound (a) | 6,7-epoxy-2-oxaspiro [3.5] nonane | | | 4 | | |
| Dioxetane | XDO | | | | | 4 |
| Compound (b) | UVI-6990 | 1.5 | 1.5 | 1.5 | 1.5 | 1.5 |
| Compound (c) | EPPN-201 | | 4 | 4 | 4 | 4 |
| Compound (d) | 5-methyl-2-oxaspiro[3.5] nonane | | | | 4 | |
| Compound (g) | Resin (A) obtained in Productive Example | 28 | 28 | 28 | 23 | 28 |
| Compound (e) | ARONICS M-305 | 3 | 3 | 3 | 3 | 3 |
| Compound (f) | Irgacure 907 | 3 | 3 | 3 | 3 | 3 |
| Sensitizer | DETX-S | 0.5 | 0.5 | 0.5 | 0.5 | 0.5 |
| Filler | talc | 16 | 16 | 16 | 16 | 16 |
| Colorant | Cyanine Green | 0.5 | 0.5 | 0.5 | 0.5 | 0.5 |
| Defoaming agent | TSA-705S | 0.5 | 0.5 | 0.5 | 0.5 | 0.5 |
| Solvent | butyl cellosolve acetate | 39 | 39 | 39 | 40 | 39 |
| Evaluation results of cured film | resolution | ○ | ○ | ○ | ○ | ○ |
| | test of adhesive property | ○ | ○ | ○ | ○ | ○ |
| | solder resistance | ◎ | ◎ | ◎ | ◎ | ◎ |
| | PCT durability | no abnormality | no abnormality | no abnormality | no abnormality | peeled |

XDO: xylylene dioxetane, produced by Toa Gosei Kagaku
UVI-6990: a light cationic polymerization initiator, produced by Union Carbide
EPPN-201: phenol novolak epoxy resin, produced by Nippon Kayaku
ARONICS M-305: pentaerythritol acrylate, produced by Toa Gosei Kagaku
Irgacure 907: a photopolymerization initiator, produced by Ciba Specialty Chemicals
DETX-S: a photosensitizer, diethylthioxanthone, produced by Nippon Kayaku
Cyanine Green: produced by Dainichi Seika
Defoaming Agent TSA-705S: produced by Toshiba Silicone

Industrial Applicability

The resist ink composition of the present invention can form a fine pattern through exposure under irradiation of an active energy ray and subsequent development with an organic solvent or a dilute alkali aqueous solution and can be completely cured by a short time-heat treatment following the film formation. The cured film obtained can become a solder resist or interlayer insulating material excellent in various properties such as resolution, adhesive property, solder resistance and pressure cooker durability.

What is claimed is:

1. A resist ink composition comprising a compound (a) having at least one oxetanyl group and at least one epoxy group within the same molecule represented by formula (1):

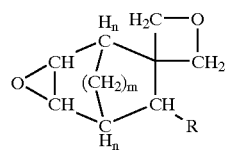

wherein R represents a hydrogen atom or a methyl group, m represents an integer of 0 to 2, and n is 2 when m is 0, and otherwise n is 1, a compound (b) capable of initiating cationic polymerization under irradiation of an active energy ray and/or under heat, a compound (c) having at least one epoxy group and not having an oxetanyl group, a compound (d) having at least one oxetanyl group and not having an epoxy group, a compound (e) having a radical polymerizable unsaturated group as well as a photo-radical polymerization initiator (f).

2. The resist ink composition according to claim 1, wherein said compound (a) is 7,8-epoxy-2-oxa-5-methylspiro[3.5]nonane and/or 6,7-epoxy-2-oxaspiro[3.5]nonane.

3. The resist ink composition according to claim 1, wherein said compound (b) capable of initiating cationic polymerization under irradiation of an active energy ray and/or under heat is at least one selected from the group consisting of a sulfonium salt, an iodonium salt, phosphonium salt and a diazonium salt.

4. The resist ink composition according to claim 1, further comprising (g) an alkali-soluble resin.

5. The resist ink composition according to claim 1, wherein said alkali-soluble resin (g) is used in an amount of 50 to 2,000 parts by mass per 100 parts by mass of the compound (a) having at least one oxetanyl group and at least one epoxy group within the same molecule.

6. A cured film obtained by curing the resist ink composition according to claim 1.

7. A solder resist cured film comprising the cured film according to claim 6.

8. An interlayer insulation cured film for a multilayer interconnection board, comprising the cured film according to claim 6.

9. A printed board comprising the cured film according to claim 6.

10. A method for producing a cured film, wherein said method comprises curing a resist ink composition according to claim 1 under irradiation of an active energy ray and/or under heat.

11. The method for producing the cured film according to claim 10, wherein said active energy ray is ultraviolet light.

* * * * *